(12) United States Patent
Teramae et al.

(10) Patent No.: US 9,389,254 B2
(45) Date of Patent: Jul. 12, 2016

(54) INFORMATION PROCESSING METHOD AND APPARATUS FOR DECIDING CONTROL PARAMETERS

(71) Applicant: FUJITSU LIMITED, Kawasaki-shi, Kanagawa (JP)

(72) Inventors: Kumiko Teramae, Setagaya (JP); Yoshiyuki Iwakura, Hadano (JP); Tsunaki Iwasaki, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 707 days.

(21) Appl. No.: 13/871,444

(22) Filed: Apr. 26, 2013

(65) Prior Publication Data

US 2013/0332097 A1    Dec. 12, 2013

(30) Foreign Application Priority Data

Jun. 11, 2012 (JP) ................. 2012-131954

(51) Int. Cl.
*G01R 23/00* (2006.01)
*G01R 23/16* (2006.01)
*G01R 27/28* (2006.01)

(52) U.S. Cl.
CPC ............... *G01R 23/16* (2013.01); *G01R 27/28* (2013.01)

(58) Field of Classification Search
CPC .... G01R 23/16; G01R 27/28; G01R 29/0871; G01R 29/0892
USPC ......................... 702/57, 66, 75–77
See application file for complete search history.

(56) References Cited

U.S. PATENT DOCUMENTS

| | | | | |
|---|---|---|---|---|
| 8,457,913 B2* | 6/2013 | Zwinger | ............ | G01R 31/2884 702/60 |
| 2007/0233405 A1* | 10/2007 | Izumi | ................. | G01R 29/0871 702/57 |
| 2013/0052962 A1* | 2/2013 | Hansen | .............. | G01R 29/0871 455/67.12 |

FOREIGN PATENT DOCUMENTS

| | | |
|---|---|---|
| JP | 04-168907 | 6/1992 |
| JP | 08-262080 | 10/1996 |
| JP | 11-295365 | 10/1999 |
| JP | 2000-346891 | 12/2000 |

* cited by examiner

*Primary Examiner* — An Do
(74) *Attorney, Agent, or Firm* — Staas & Halsey LLP (57) ABSTRACT

A computer-readable-recording-medium stored a program for causing a computer to execute: judging, for each of elements of a plurality of scattering parameters, whether a difference between a first-area in a plane containing an axis representing frequency and an axis representing the element, and a second-area in the plane is within a permissible range, the first-area being surrounded by a first-element-value series of the element that is defined in advance for a plurality of first-frequencies, the second-area being surrounded by a second-element-value series that is obtained by performing interpolation calculation from the first-element-value series for a plurality of second frequencies which are different from the plurality of first-frequencies and which are provided at regular intervals; and determining, by performing the judging for one interval or a plurality of intervals, an interval so that the difference falls within the permissible range for all of the elements of the plurality of scattering parameters.

7 Claims, 9 Drawing Sheets

| FREQUENCY (Hz) | S11 | S12 | S21 | S22 |
|---|---|---|---|---|
| 0 | 0.001, 0 | 0.99, 0 | 0.99, 0 | 0.001, 0 |
| 1000000 | 0.003, 0.01 | 0.98, -0.01 | 0.98, -0.01 | 0.003, 0.01 |
| 1140000 | 0.003, 0.02 | 0.98, -0.01 | 0.98, -0.01 | 0.003, 0.02 |
| 1460000 | 0.004, 0.03 | 0.98, -0.02 | 0.98, -0.02 | 0.004, 0.03 |
| 1780000 | 0.005, 0.04 | 0.96, -0.03 | 0.96, -0.03 | 0.005, 0.04 |
| 2100000 | 0.006, 0.05 | 0.95, -0.03 | -95, -0.03 | 0.06, 0.05 |
| ⋮ | ⋮ | ⋮ | ⋮ | ⋮ |

FIG. 4

| INTERVAL (Hz) |
|---|
| 140000 |
| 320000 |
| ⋮ |
| ⋮ |

INFORMATION PROCESSING METHOD AND APPARATUS FOR DECIDING CONTROL PARAMETERS

CROSS-REFERENCE TO RELATED APPLICATION

This application is based upon and claims the benefit of priority from the prior Japanese Patent Application No. 2012-131954 filed on Jun. 11, 2012, the entire contents of which are incorporated herein by reference.

FIELD

The embodiment discussed herein is related to a technology for setting control parameters for a circuit analysis system.

BACKGROUND

An S parameter is one of circuit network parameters that are used to represent the characteristics of a high-frequency electronic circuit or a high-frequency electronic part, and is also called a scattering parameter. An electronic circuit system (even one high-frequency electronic part is considered as one small system) is assumed, which has n ports (in a system characterized by S parameters, a terminal is typically called a port) and which is characterized by S parameters. When a sine wave is input to one of the ports, the S parameters of the system represent a ratio at which the sine wave is transmitted to another one of the ports, a ratio at which the sine wave is reflected to the port to which the sine wave has been input, and phase delays of the transmitted wave and the reflected wave with respect to the input sine wave.

Each of the S parameters is a complex number. The absolute value of the complex number represents a transmission ratio (a reflection ratio), and an argument of the complex number represents a phase delay. The transmission ratio and the phase delay of a transmitted wave are collectively called a transmission coefficient, and the reflection ratio and the phase delay of a reflected wave are collectively called a reflection coefficient.

When multiple ports are present in a system, a sine wave is input to each of the ports, and a transmission coefficient and a reflection coefficient in this case are obtained. In other words, one reflection coefficient and n−1 transmission coefficients, that is, n parameters in sum, are obtained for one input port. Because the n parameters are present for each of the n input ports, n×n parameters are present. A file in which the S parameters are written is an S-parameter file.

When the frequency of the input sine wave changes, the characteristics of the system change. Accordingly, in the S-parameter file, the n×n parameters are written in a matrix for each frequency of the input sine wave.

In the case of printed wiring board design, a circuit simulator is used in transmission-line analysis for signal integrity (SI) verification or a power-supply board analysis for power integrity (PI) verification. As models to be analyzed, passive elements, such as resistors R, inductors L, and capacitors C, are used, and, in addition, elements (hereinafter, S elements) that represent, using S parameters, the characteristics of filters, vias, connectors, and transmission-line systems are also used.

The circuit simulator recognizes a circuit network in which the passive elements, the S elements, active elements such as diodes and complementary metal oxide semiconductor (MOS) transistors, and various power sources are electrically connected. An element is connected to a "node" that is electrically equipotential in the circuit network. Then, the circuit simulator calculates a change, over time, in a voltage at each node or a current flowing into each element in accordance with Kirchhoff's circuit laws that are basic laws of a circuit network theory.

Typically, in order to calculate the value of a current flowing into an S element, the circuit simulator performs inverse Fourier transform on S parameters to obtain an impulse response function, and calculates the convolution of the voltage of a terminal of the S element and the impulse response function in the time domain. Moreover, typically, the inverse fast Fourier transform (IFFT) algorithm is used as an algorithm of inverse Fourier transform using a computer. N pieces of data to be passed on to an IFFT function are extracted, from the S parameters, at frequencies that are set at regular intervals. As a condition for the IFFT algorithm, there is a condition where N is a power of 2.

As a method for obtaining S parameters, for example, a method in which actual measurement using a spectrum analyzer is performed, a method in which S parameters are calculated using an S-parameter extraction simulator, or a method in which an S-parameter library that is supplied from a circuit-part vendor is acquired is considered. Regarding the S parameters that have been acquired using any one of the methods, frequencies that are written are not necessarily frequencies provided at regular intervals. The number of frequencies (also referred to as the number of data items or the number of sampling points) is not necessarily a power of 2.

In a circuit simulator that is capable of supporting an S element, typically, various control parameters related to sampling for IFFT are prepared. More specifically, the control parameters are a sampling frequency interval (referred to as "FBASE") of S parameters, a maximum frequency (FMAX) which indicates that sampling of the S parameters at frequencies up to the maximum frequency FMAX is performed, an interpolation method (INTERPOLATION) and extrapolation methods (LOWPASS and HIGHPASS) in the case of performing data interpolation, and so forth.

When the value of FBASE, FMAX, INTERPOLATION, LOWPASS, or HIGHPASS is changed, a result of calculation using IFFT (that is, an impulse response function) changes. Thus, the result of the convolution of the impulse response function and a signal changes, and, consequently, the result of circuit simulation changes. However, such control parameters are not appropriately set in the related art.

Japanese Laid-open Patent Publications No. 2000-346891, No. 11-295365, No. 08-262080, and No. 04-168907 are examples of the related art.

SUMMARY

According to an aspect of the invention, a computer-readable-recording-medium stored a program for causing a computer to execute: judging, for each of elements of a plurality of scattering parameters, whether a difference between a first-area in a plane containing an axis representing frequency and an axis representing the element, and a second-area in the plane is within a permissible range, the first-area being surrounded by a first-element-value series of the element that is defined in advance for a plurality of first-frequencies, the second-area being surrounded by a second-element-value series that is obtained by performing interpolation calculation from the first-element-value series for a plurality of second frequencies which are different from the plurality of first-frequencies and which are provided at regular intervals; and determining, by performing the judging for one interval or a plurality of intervals, an interval so that the difference falls within the permissible range for all of the elements of the plurality of scattering parameters.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
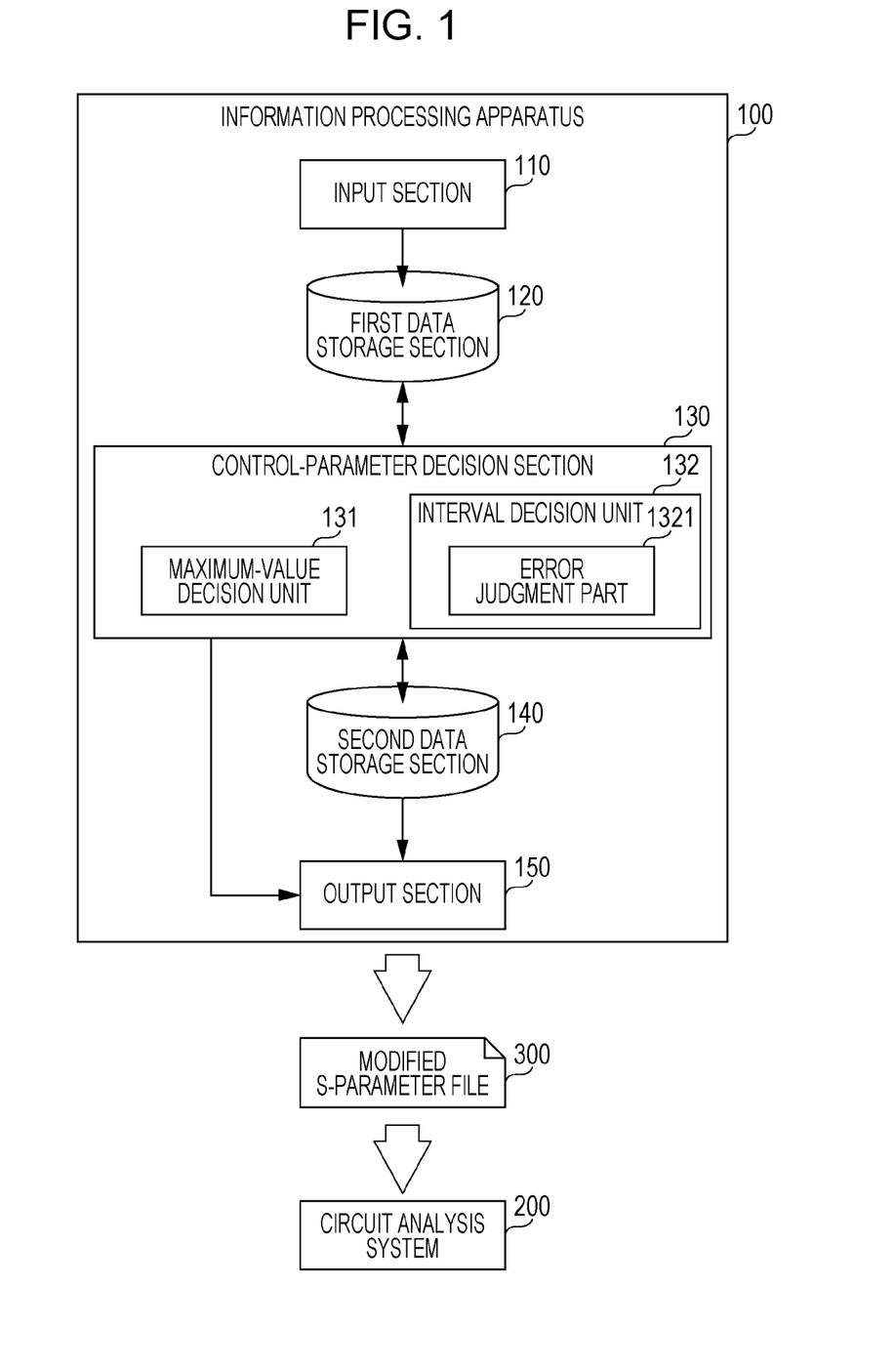
FIG. 1 is a diagram schematically illustrating a system according to an embodiment.

An example of a configuration of a system according to an embodiment is illustrated in FIG. 1. A system according to the present embodiment includes an information processing apparatus 100 and a circuit analysis system 200 that includes a circuit simulator which is connected to the information processing apparatus 100 via a network or the like. Note that the information processing apparatus 100 and the circuit analysis system 200 may be formed as one piece.

A modified S-parameter file 300 that is an output of the information processing apparatus 100 is input to the circuit analysis system 200. However, because the circuit analysis system 200 is substantially the same as a circuit analysis system of the related art, a further description thereof is omitted.

The information processing apparatus 100 includes an input section 110, a first data storage section 120, a control-parameter decision section 130, a second data storage section 140, and an output section 150. The control-parameter decision section 130 includes a maximum-value decision unit 131 and an interval decision unit 132. The interval decision unit 132 includes an error judgment part 1321.

In the present embodiment, the input section 110 accepts an S-parameter file and various types of parameters that have been obtained by a user in a certain manner, and stores the S-parameter file and the various types of parameters in the first data storage section 120. The maximum-value decision unit 131 of the control-parameter decision section 130 decides, using data stored in the first data storage section 120, a maximum frequency FMAX that is a control parameter. Furthermore, the interval decision unit 132 decides, using the data stored in the first data storage section 120, a frequency interval FBASE that is a control parameter. The error judgment part 1321 judges whether or not an error, which is described below in the description of the case of deciding the frequency interval FBASE, is within a permissible range. The control-parameter decision section 130 writes the decided control parameters in the S-parameter file stored in the first data storage section 120, and stores the S-parameter file in the second data storage section 140. The output section 150 outputs a modified S-parameter file 300, which is stored in the second data storage section 140, to a display device or another computer (including the circuit analysis system 200).

Figure 2:
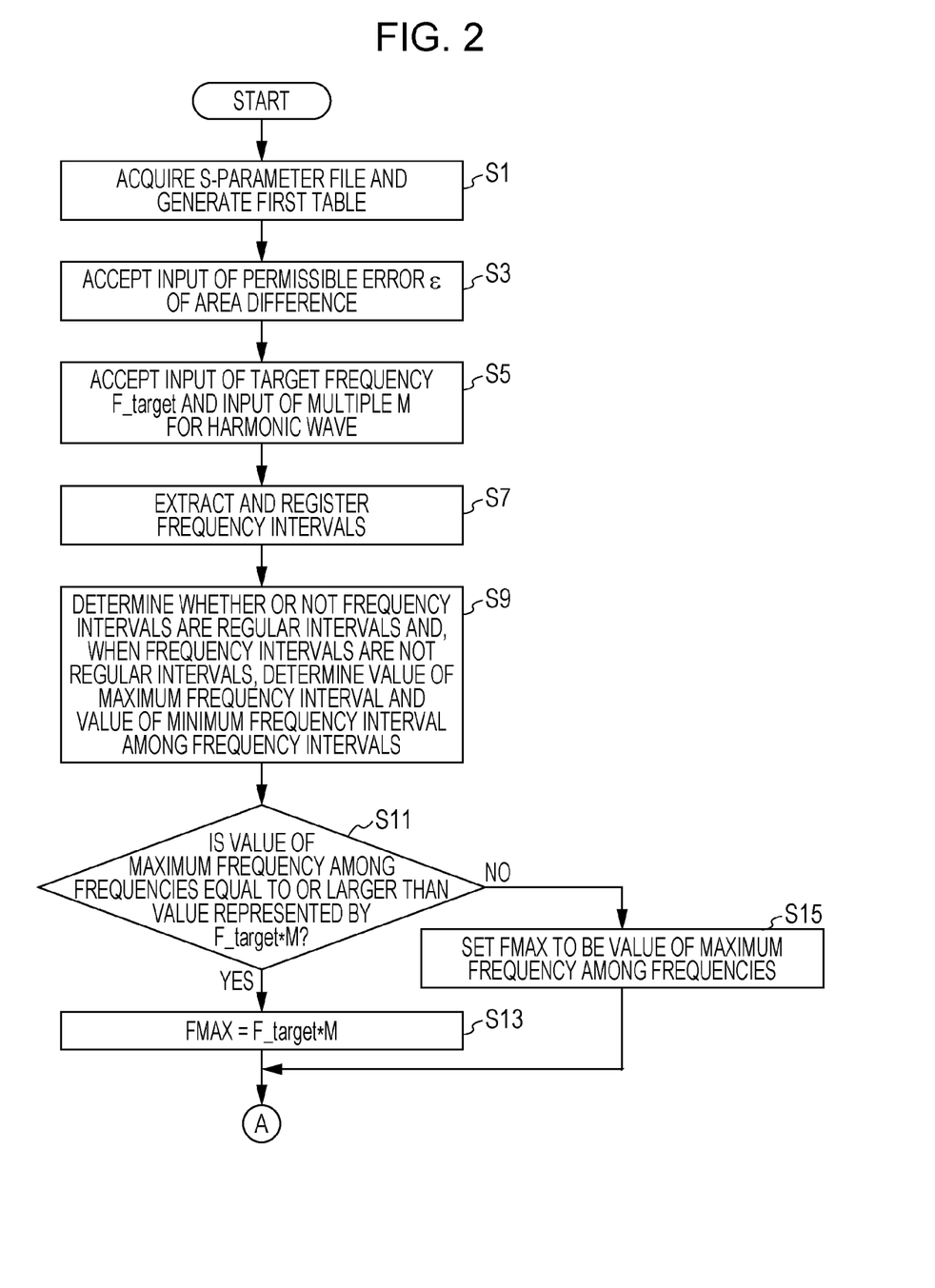
FIG. 2 is a flowchart of a process flow in the embodiment.
Figure 3:
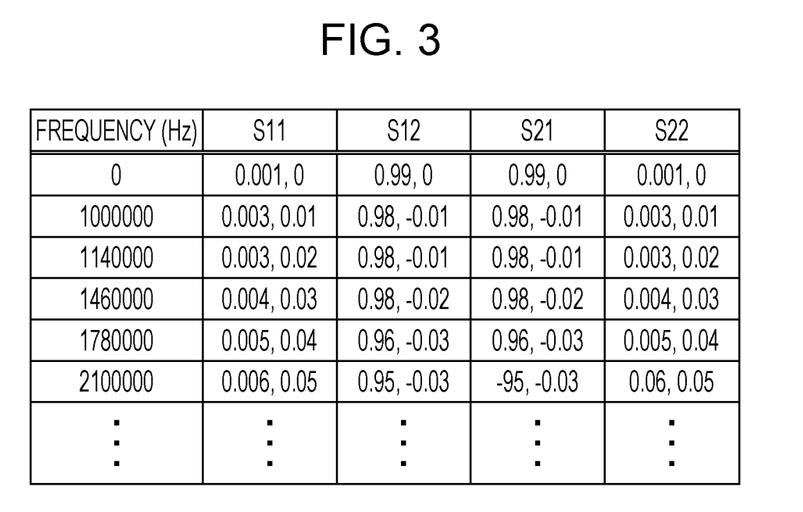
FIG. 3 is a diagram illustrating an example of a first table.

Next, the details of processes performed in the information processing apparatus 100 will be described using FIGS. 2 to 10. First, the input section 110 accepts an input of an S-parameter file from the user or reads an S-parameter file stored in another computer, and stores the S-parameter file in the first data storage section 120. The input section 110 generates a first table from the S-parameter file, and stores the first table in the first data storage section 120 (step S1 in FIG. 2). For example, a first table illustrated in FIG. 3 is generated. FIG. 3 illustrates examples of S parameters in the case of two ports. Values of S parameters S11, S12, S21, and S22 are registered for each of frequencies (also referred to as "sampling points"). Note that each of the S parameters S11 to S22 is a complex number, and is a pair of a real part and an imaginary part. Because such data is registered in the S-parameter file, such data is read and registered in the first table.

Furthermore, the input section 110 accepts an input of a permissible error (also referred to as a "permissible range") ε of an area difference that is to be calculated below, and stores the permissible error ε in the first data storage section 120 (step S3). Moreover, the input section 110 accepts an input of a target frequency F_target for analysis and an input of a multiple M for a harmonic wave (M times of the target frequency), and stores the target frequency F_target and the multiple M in the first data storage section 120 (step S5). Note that a default value, for example, 5 or 10, may be used as the multiple M.

Figure 4:
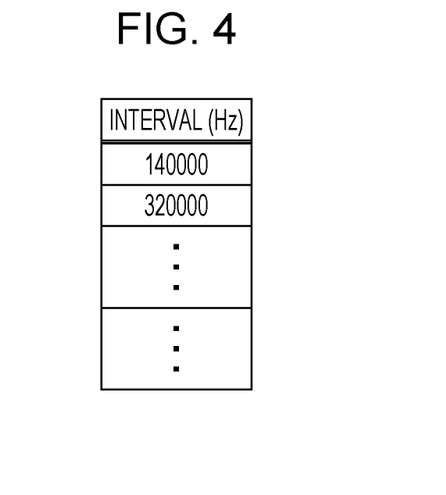
FIG. 4 is a diagram illustrating an example of a second table.

Then, the interval decision unit 132 of the control-parameter decision section 130 extracts frequency intervals from the first table stored in the first data storage section 120, and registers the frequency intervals in a second table of the first data storage section 120 (step S7). An example of data stored in the second table is illustrated in FIG. 4. In the example illustrated in FIG. 4, types of frequency intervals that have been extracted are listed. Note that multiple types of frequency intervals may be extracted, or only one frequency interval may be extracted. In the example illustrated in FIG. 3, multiple types of frequency intervals are extracted.

Furthermore, the interval decision unit 132 determines, based on the second table, whether or not the frequency intervals are regular intervals. When the frequency intervals are not regular intervals, the interval decision unit 132 determines the value of a maximum frequency interval and the value of a minimum frequency interval among the frequency intervals (step S9). For example, when the frequency intervals are regular intervals, the interval decision unit 132 substitutes the value of the frequency intervals for a variable Equal_delta_f. When the frequency intervals are regular intervals, the interval decision unit 132 substitutes "−1" for the variable Equal_delta_f. Moreover, the interval decision unit 132 substitutes the value of the maximum frequency interval for a variable f_step_max, and substitutes the value of the minimum frequency interval for a variable f_step_min.

Then, the maximum-value decision unit 131 of the control-parameter decision section 130 judges whether the value of a maximum frequency among the frequencies stored in the first table is equal to or larger than a value represented by an expression the target frequency F_target*M (step S11). When the value of the maximum frequency among the frequencies is equal to or larger than the value represented by the expression the target frequency F_target*M, the maximum-value decision unit 131 temporarily sets the maximum frequency FMAX to be the value represented by expression the target frequency F_target*M (step S13). Then, the process proceeds to a process illustrated in FIG. 5 via a connector A. In contrast, when the value of the maximum frequency among the frequencies is smaller than the value represented by the expression the target frequency F_target*M, no data equal to or larger than the value represented by the expression the target frequency F_target*M is present. Accordingly, the maximum-value decision unit 131 sets the maximum frequency FMAX to be the value of the maximum frequency among the frequencies stored in the first table (step S15). Then, the process proceeds to the process illustrated in FIG. 5 via the connector A.

Figure 5:
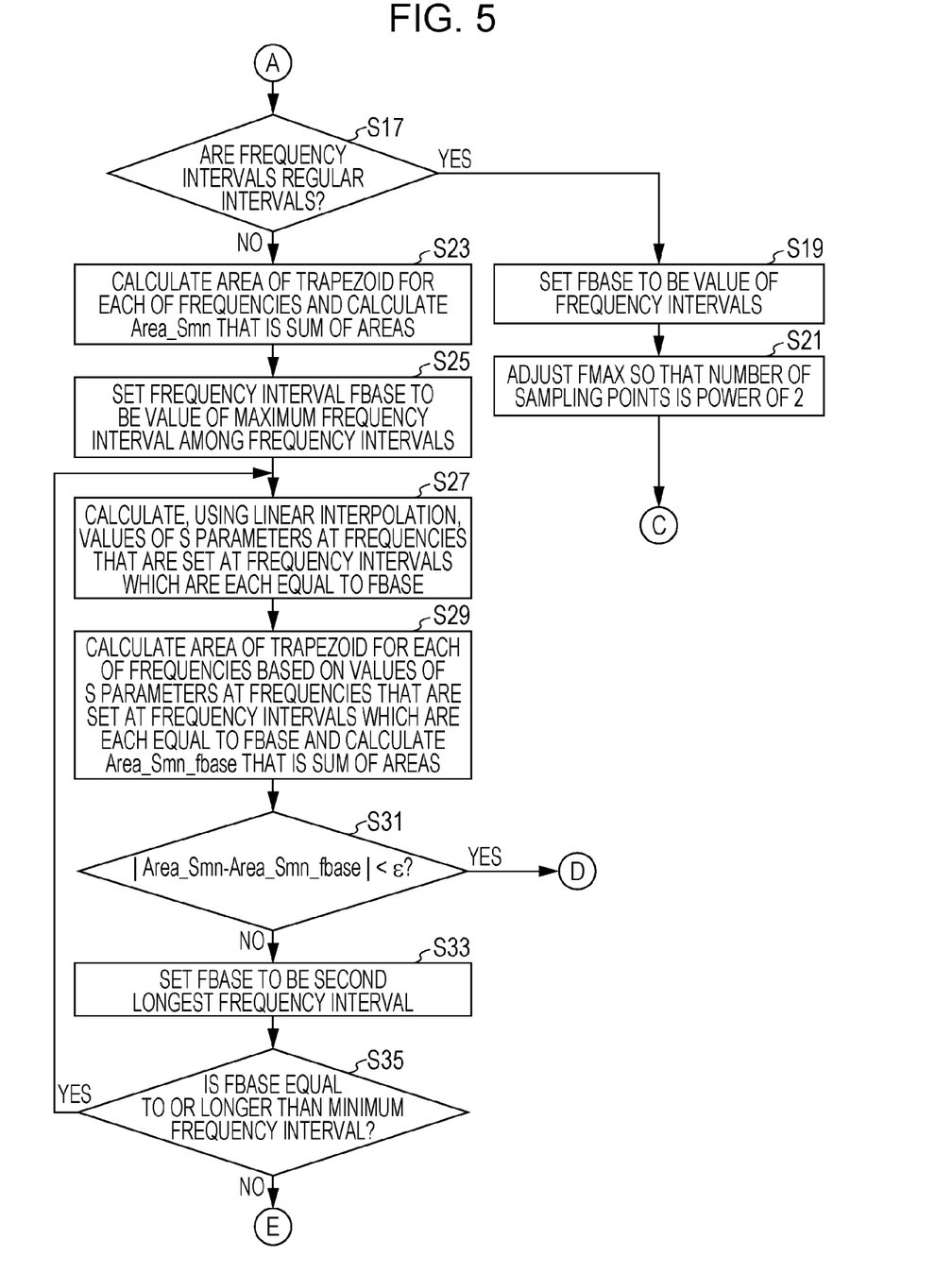
FIG. 5 is a flowchart of the process flow in the embodiment.

Referring to FIG. 5, the interval decision unit 132 judges whether the frequency intervals are regular intervals (step S17). That is, the interval decision unit 132 judges whether a value that is not "−1" is set as the variable Equal_delta_f. When the frequency intervals are regular intervals, the interval decision unit 132 sets the frequency interval FBASE to be the value of the frequency intervals (step S19). When the frequency intervals are regular intervals as described above, there is no problem. Accordingly, the process proceeds to a process that is to be performed by the maximum-value decision unit 131. In other words, the maximum-value decision unit 131 judges whether the number of sampling points in the first table (the number of records in the first table) is a power of 2. When the number of sampling points is not a power of 2, the maximum-value decision unit 131 determines a frequency which is equal to or lower than the maximum frequency FMAX and whose ordinal position in the series of frequencies is the highest power of 2, and sets the maximum frequency FMAX to be the determined frequency (step S21). The process proceeds to a process illustrated in FIG. 10 via a connector C.

In contrast, when the frequency intervals are not regular intervals, the error judgment part 1321 of the interval decision unit 132 calculates, for each of the elements of the S parameters (each real-part element Smn of the S parameters S11 to S21) stored in the first table, in a plane containing an axis representing the element (no unit) and an axis representing frequency, the area of a trapezoid (a triangle in some cases) that is formed, for each of the frequencies, by the frequency, an element value (also referred to as a "parameter value") at the frequency, the next frequency, and an element value at the next frequency. Additionally, the error judgment part 1321 calculates a sum Area_Smn that is the sum of the areas (step S23).

Figure 6:
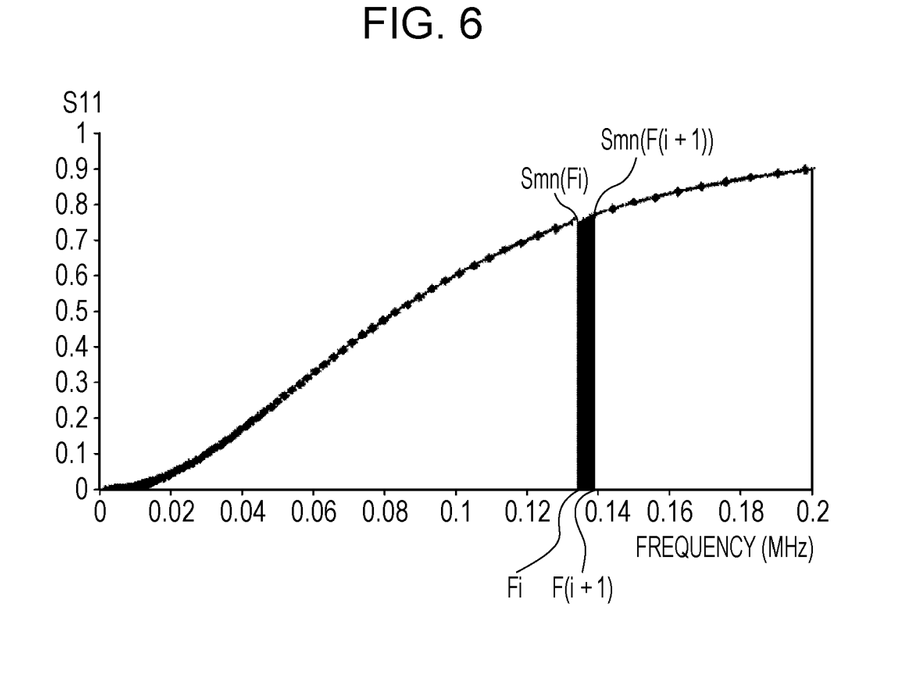
FIG. 6 is a graph for explaining the area of a trapezoid.

For example, in FIG. 6, for the individual sampling points that are frequencies from a minimum frequency FMIN up to the maximum frequency FMAX in the S-parameter file, the values of the real part of the S parameter S11 are plotted in a plane containing an axis representing frequency and an axis representing the real part of S11. In this case, for each of the frequencies in order from the minimum frequency FMIN, the area (the portion shaded with dots in FIG. 6) of a trapezoid that is surrounded by a frequency Fi which is being processed, a value Smn(Fi) of the real part of the S parameter S11 at the frequency Fi which is being processed, a next frequency F(i+1) that is next to the frequency Fi which is being processed, and a value Smn(F(i+1)) of the real part of the S parameter S11 at the next frequency F(i+1) is calculated.

Then, a sum Area_Smn that is the sum of the areas is calculated. The sum Area_Smn is used as a reference value.

Figure 7:
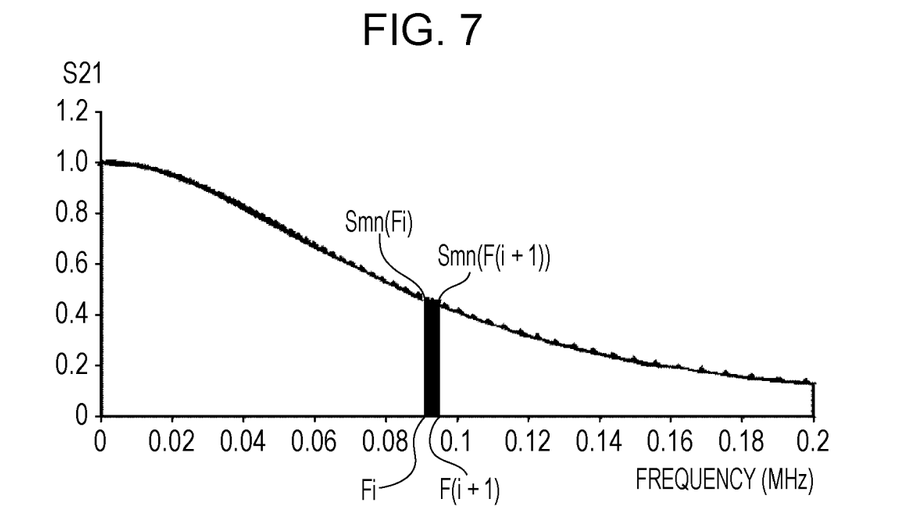
FIG. 7 is a graph for explaining the area of a trapezoid.

Furthermore, for example, in FIG. 7, the values of the real part of the S parameter S21 for the individual sampling points that are frequencies from the maximum frequency FMAX up to the minimum frequency FMIN are plotted in a plane containing an axis representing frequency and an axis representing the real part of the S parameter S21. Also in this case, the area of a trapezoid is similarly calculated for each of the frequencies, and a sum Area_Smn that is the sum of the areas is calculated.

Moreover, the error judgment part 1321 of the interval decision unit 132 sets the frequency interval FBASE to be the value of the variable f_step_max that is the value of the maximum frequency interval among the frequency intervals (step S25).

Then, the error judgment part 1321 of the interval decision unit 132 calculates, using linear interpolation, from the data stored in the first table, the values of the S parameters at frequencies that are set at frequency intervals which are each equal to the frequency interval FBASE, and stores the values of the S parameters in, for example, the first data storage section 120 (step S27). Then, for each of the elements of the S parameters, the error judgment part 1321 of the interval decision unit 132 calculates, in the plane, the area of a trapezoid (a triangle in some cases) that is formed, for each of the frequencies that are set at frequency intervals which are each equal to the frequency interval FBASE, by the frequency, an interpolation element value at the frequency, the next frequency, and an interpolation element value at the next frequency. Additionally, the error judgment part 1321 calculates a sum Area_Smn_fbase that is the sum of the areas (step S29).

Figure 8:
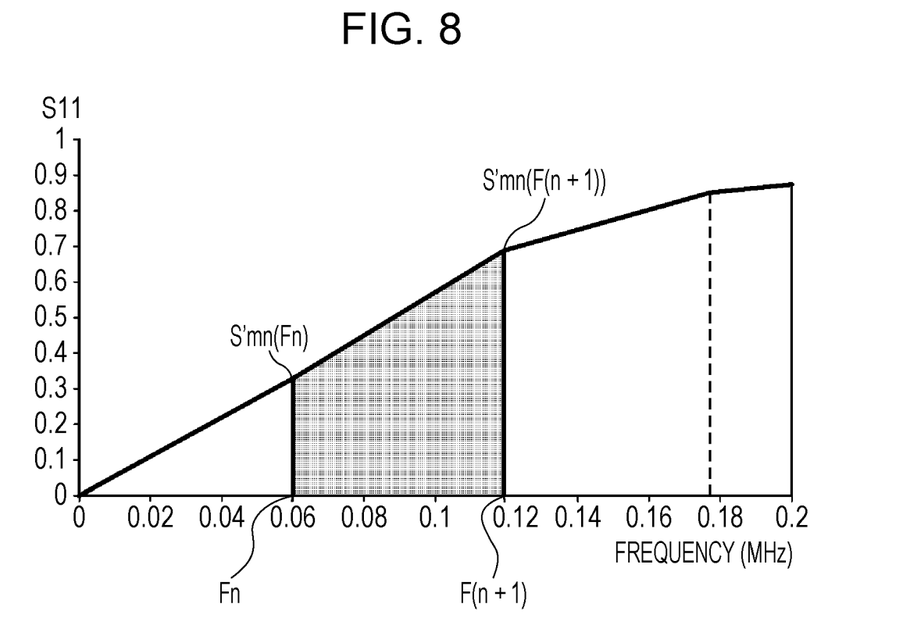
FIG. 8 is a graph for explaining the area of a trapezoid after frequency intervals are made to be regular intervals and linear interpolation is performed.

For example, in FIG. 8, for the individual frequencies from the minimum frequency FMIN up to the maximum frequency FMAX, the frequencies being set at frequency intervals which are each equal to the frequency interval FBASE, the values (the real part) of the S parameter S11 that have been calculated using linear interpolation are plotted in the plane containing the axis representing frequency and the axis representing the real part of S11. One portion is illustrated in an enlarged manner in FIG. 8. However, the frequency intervals are regular frequency intervals that are each equal to the frequency interval FBASE. The area (the portion shaded with dots in FIG. 8) of a trapezoid that is surrounded by a new sampling point Fn which is each of the sampling points that are set at frequency intervals which are each equal to the frequency interval FBASE, a value S'mn(Fn) of the real part of the S parameter S11 at the new sampling point Fn, a next new sampling point F(n+1) that is next to the new sampling point Fn, and a value S'mn(F(n+1)) of the real part of the S parameter S11 at the next new sampling point F(n+1) is calculated. Then, a sum Area_Smn_fbase that is the sum of the areas is calculated.

Figure 9:
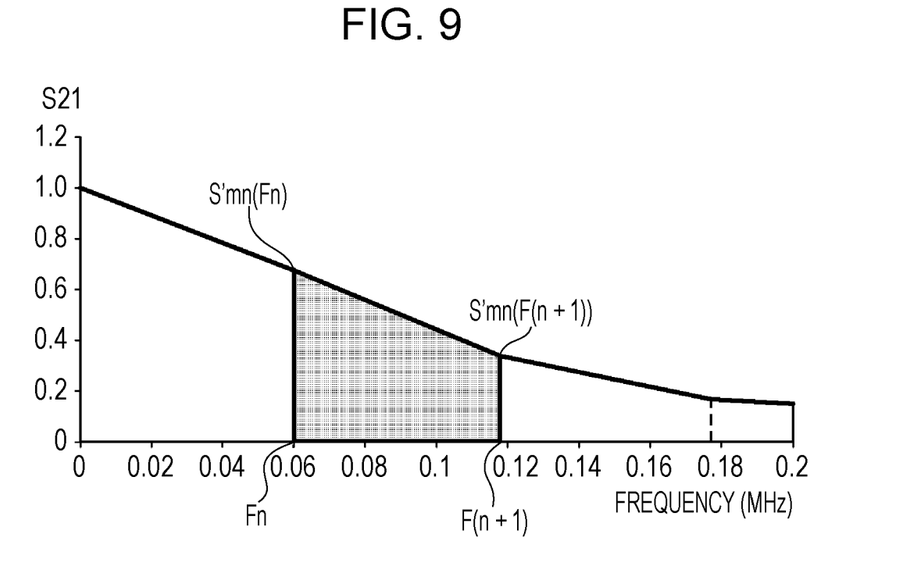
FIG. 9 is a graph for explaining the area of a trapezoid after frequency intervals are made to be regular intervals and linear interpolation is performed.

Furthermore, for example, in FIG. 9, for the individual frequencies from the minimum frequency FMIN up to the maximum frequency FMAX, the frequencies being set at frequency intervals which are each equal to the frequency interval FBASE, the values (the real part) of the S parameter S21 that have been calculated using linear interpolation are plotted in the plane containing the axis representing frequency and the axis representing the real part of the S parameter S21. Also in this case, the area of a trapezoid is similarly calculated for each of the new sampling points, and a sum Area_Smn_fbase that is the sum of the areas is calculated.

Then, the error judgment part 1321 of the interval decision unit 132 judges whether a relationship |Area_Smn−Area_Smn_fbase|<ε is satisfied for each of the elements of the S parameters (step S31). For all of the elements, when this condition is satisfied, that is, when an error in the sum of the areas is within the permissible range, the process proceeds to a process illustrated in FIG. 10 via a connector D.

In contrast, when this condition is not satisfied for one of the elements, the error judgment part 1321 of the interval decision unit 132 sets the frequency interval FBASE to be the second longest frequency interval stored in the second table (step S33). However, when there is no second longest frequency interval, the error judgment part 1321 sets the frequency interval FBASE to be zero. Then, the error judgment part 1321 of the interval decision unit 132 judges whether the frequency interval FBASE is equal to or longer than the minimum frequency interval f_step_min (step S35). When the frequency interval FBASE is equal to or longer than the minimum frequency interval f_step_min, the process returns to step S27. In contrast, when the frequency interval FBASE is shorter than the minimum frequency interval f_step_min, the process proceeds to a process illustrated in FIG. 10 via a connector E.

Figure 10:
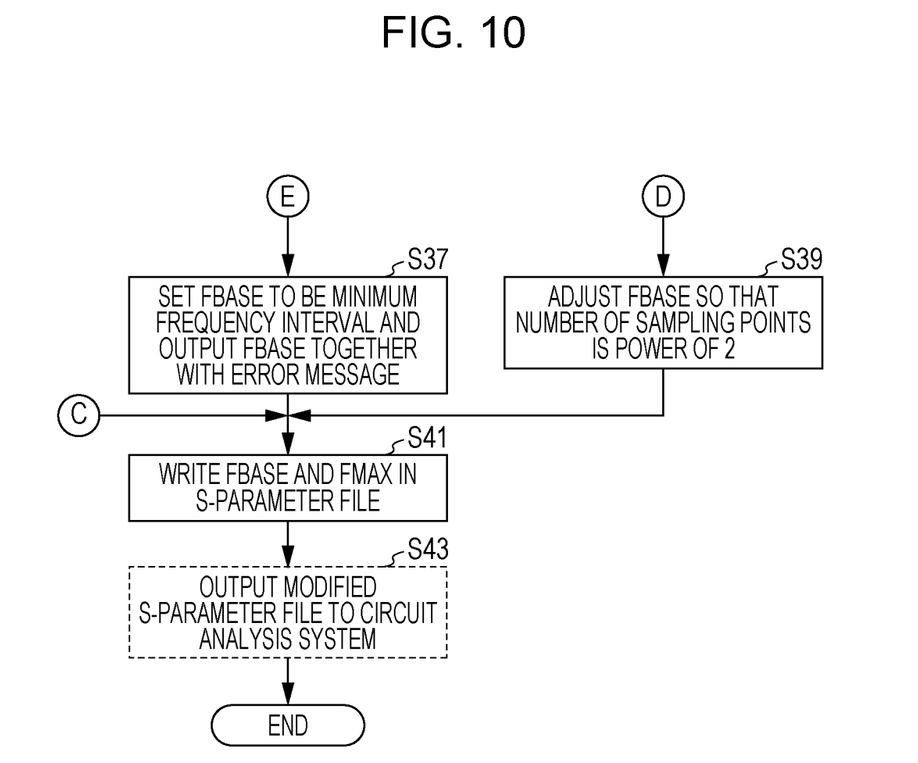
FIG. 10 is a flowchart of the process flow in the embodiment.

Referring to FIG. 10, after the connector E, the interval decision unit 132 sets the frequency interval FBASE to be the minimum frequency interval f_step_min, and causes the output section 150 to output the frequency interval FBASE together with an error message to the display device or the like (step S37). For example, the output section 150 outputs a message saying that "the accuracy will not be improved even when the sampling interval is made shorter than the current sampling interval. Please set the data interval for the S parameters to be shorter and perform measurement again". Then, the process proceeds to step S41.

In contrast, after the connector D, when the error in the sum of the areas is within the permissible range, the interval decision unit 132 adjusts the frequency interval FBASE again so that the number of sampling points which are to be set at frequency intervals that are each equal to the frequency interval FBASE is a power of 2 (step S39). For example, when the number of sampling points in the case where sampling at frequencies up to the maximum frequency FMAX, the frequencies being set at frequency intervals which are each equal to the frequency interval FBASE, is performed is a power of 2, the interval decision unit 132 does not adjust the frequency interval FBASE. In contrast, when the number of sampling points in the case where sampling at frequencies up to the maximum frequency FMAX, the frequencies being set at frequency intervals which are each equal to the frequency interval FBASE, is performed is not a power of 2, the interval decision unit 132 calculates a minimum integer Nx that satisfies a relationship $Nx \geq FMAX/FBASE$. The interval decision unit 132 calculates a minimum k that satisfies a relationship $2^k \geq Nx$, and sets a value represented by an equation $FBASE=FMAX/2^k$ as the adjusted frequency interval FBASE. In this manner, a frequency interval that is equal to or shorter than a frequency interval which is determined so that an accuracy error falls within the permissible range and that is the longest frequency interval among frequency intervals which satisfy a condition where the number of sampling points is a power of 2 may be decided without changing the maximum frequency FMAX. Then, the process proceeds to step S41.

In step S41, the control-parameter decision section 130 writes the frequency interval FBASE and the maximum frequency FMAX that have been determined so far, as comments of the S-parameter file stored in the first data storage section 120, for example, in the header portion of the S-parameter file, and stores the frequency interval FBASE and the maximum frequency FMAX in the second data storage section 140 (step S41).

After that, in accordance with, for example, an instruction from the user, the output section 150 reads the modified S-parameter file 300 from the second data storage section 140, and outputs the modified S-parameter file 300 to the circuit analysis system 200 (step S43). Note that, because step S43 is not performed when an error occurs or the user does not provide any instruction due to another reason, step S43 is illustrated as a dotted-line block.

By performing the above-described processes, a frequency interval may be decided based on a frequency interval which is the longest frequency interval among frequency intervals between frequencies defined in the S-parameter file and which is determined so that a reduction in the accuracy falls within the permissible range. In other words, because a frequency interval as long as possible may be set, an increase in the processing load imposed on the circuit analysis system 200 may be reduced.

Figure 11:
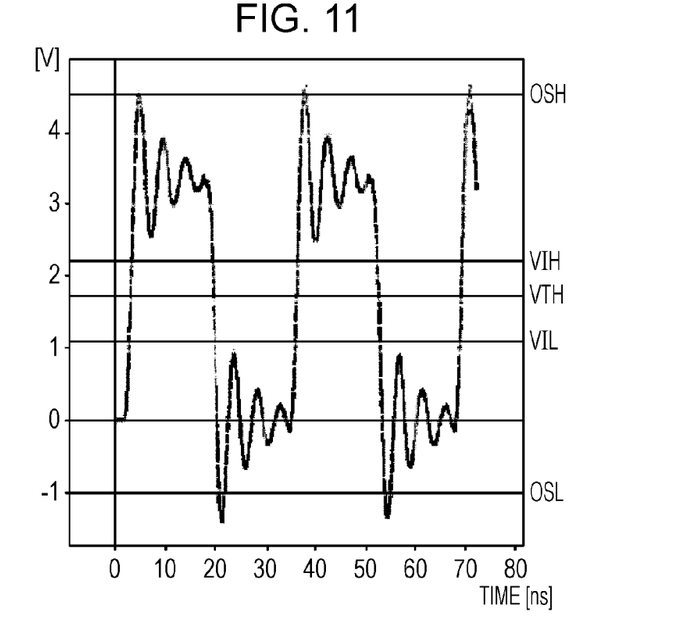
FIG. 11 is a waveform diagram for explaining effects.
Figure 12:
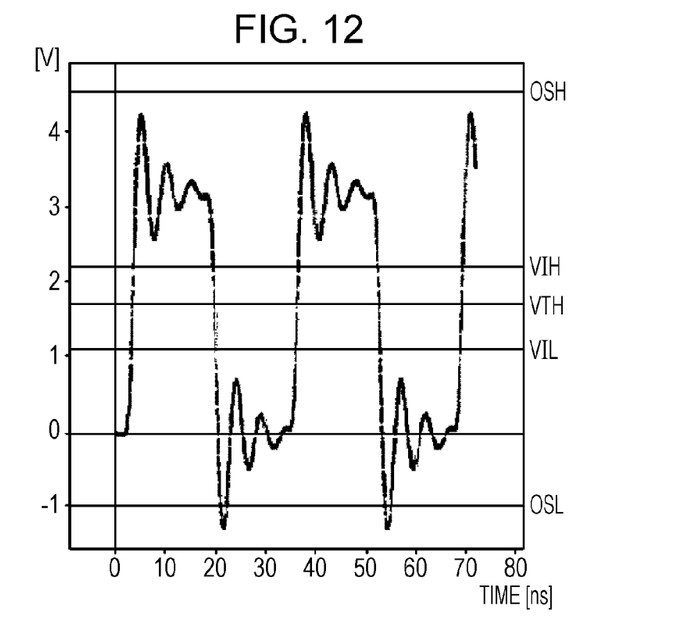
FIG. 12 is a waveform diagram for explaining effects.

Note that, in the case where default values of the control parameters, such as the frequency interval FBASE and maximum frequency FMAX, are used as they are as in the related art, a signal having a waveform with a large overshoot and a large undershoot is generated as a simulation result, for example, as illustrated in FIG. 11. In contrast, in the case where the frequency interval FBASE and maximum frequency FMAX are set by the above-described processes, even regarding the same signal, a waveform with an overshoot and an undershoot that are smaller than those in the case where the default values of the control parameters are used as in the related art is generated as illustrated in FIG. 12. In other words, more appropriate circuit simulation is performed.

The present embodiment is described above. However, the embodiment is not limited thereto. For example, in the example described above, a loop from step S27 to step S35 illustrated FIG. 5 is performed, based on the frequency intervals between the frequencies that are initially defined in the S-parameter file. However, this loop may be performed while the frequency interval FBASE is being reduced by a fixed value. Furthermore, various variations may be possible for the process of setting the number of sampling points to be a power of 2. The process of step S21 may be also performed in step S39. Moreover, if the processing load imposed on the circuit analysis system 200 is allowed to slightly increase, k may be set to be a smaller value also in step S39. Also in step S21, similarly, a smaller value may be employed as the maximum frequency FMAX.

Additionally, the configuration diagram of the system illustrated in FIG. 1 is an example, and may not necessarily match an actual program module configuration. Furthermore, regarding the process flow, the processes may be performed in parallel or the ordinal positions of some of the processes may be swapped in the order of the processes, as long as the results of the processes do not change.

Furthermore, regarding linear interpolation, for example, not only linear interpolation from values $Smn(Fi)$ and $Smn(F(i+1))$ at sampling points $Fi$ and $F(i+1)$ that are defined at both sides of a sampling point $Fn$, but also interpolation from element values of more sampling points may be performed.

Furthermore, in the example described above, an example is described, in which the frequency interval FBASE and the maximum frequency FMAX are written in the S-parameter file. However, separately from that, the frequency interval FBASE and the maximum frequency FMAX may be input to the circuit analysis system 200.

Figure 13:
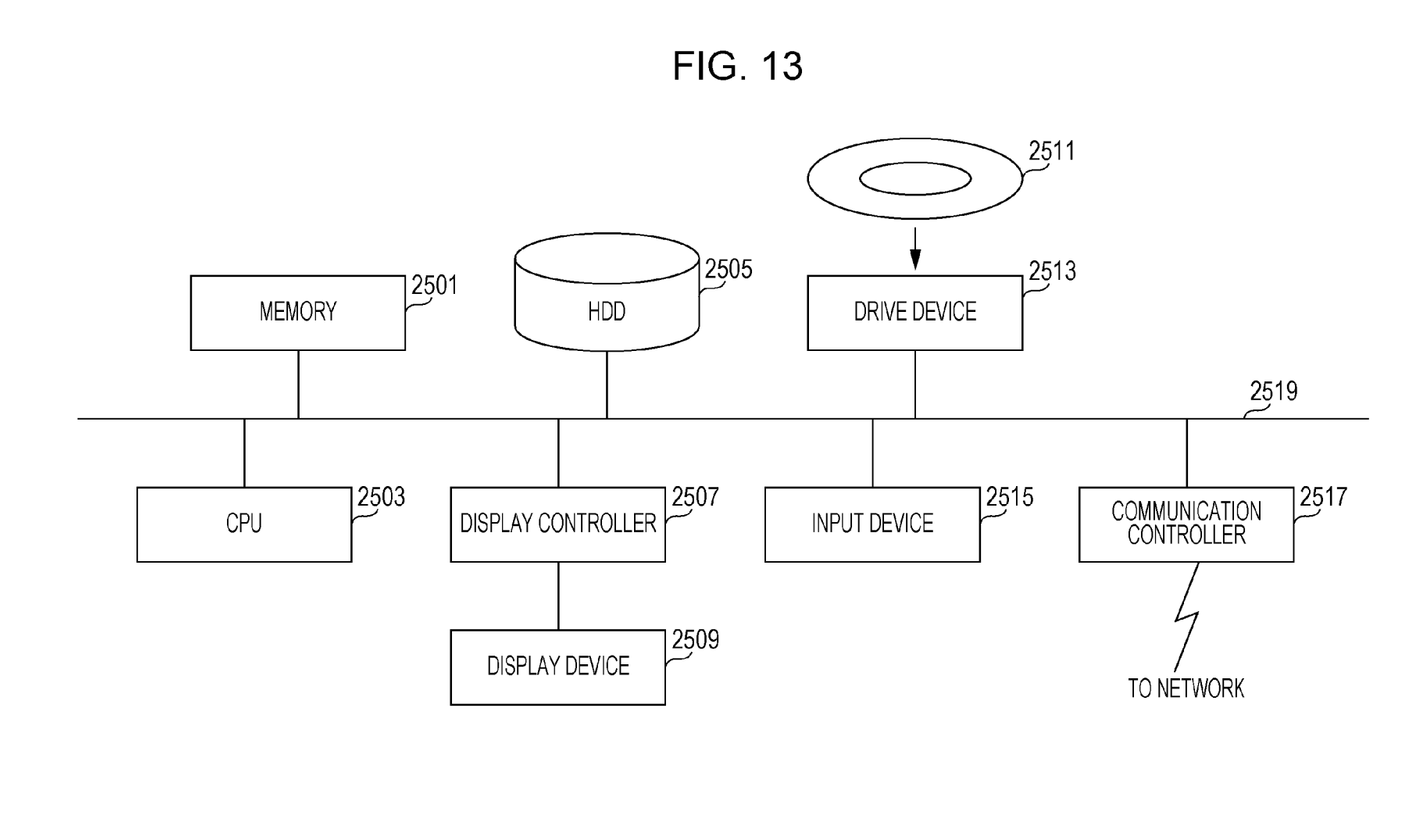
FIG. 13 is a functional block diagram of a computer.

Note that the information processing apparatus 100 described above is a computer apparatus. As illustrated in FIG. 13, in the information processing apparatus 100, a memory 2501, a central processing unit (CPU) 2503, a hard disk drive (HDD) 2505, a display controller 2507 that is connected to a display device 2509, a drive device 2513 that is used for a removable disk 2511, an input device 2515, and a communication controller 2517 that is used to connect to a network are connected to each other via a bus 2519. An operating system (OS) and an application program that is used to perform the processes in the present embodiment are stored in the HDD 2505. When the OS and the application program are to be executed by the CPU 2503, the OS and the application program are loaded from the HDD 2505 into the memory 2501. The CPU 2503 controls the display controller 2507, the communication controller 2517, and the drive device 2513 in accordance with the details of the processes of the application program, thereby causing the display controller 2507, the communication controller 2517, and the drive device 2513 to perform predetermined operations. Furthermore, although data obtained in the course of the processes is mainly stored in the memory 2501, the data may be stored in the HDD 2505. In the embodiment, the application program used to perform the above-described processes is stored in the computer-readable removable disk 2511, supplied, and installed in the HDD 2505 from the drive device 2513. The application program may be installed in the HDD 2505 via a network, such as the Internet, and the communication controller 2517. In such a computer apparatus, hardware, such as the CPU 2503 and the memory 2501 that are mentioned above, and programs, such as the OS and the application program, are organically collaborated with each other, whereby the above-described various types of functions are realized.

The foregoing present embodiment is summarized as follows.

An information processing method according to the present embodiment includes the following: (A) judging, for each of elements of a plurality of scattering parameters, whether a difference between a first area in a plane containing an axis representing frequency and an axis representing the element, and a second area in the plane is within a permissible range, the first area being surrounded by a first element value series of the element that is defined in advance for a plurality of first frequencies, the second area being surrounded by a second element value series that is obtained by performing interpolation calculation from the first element value series for a plurality of second frequencies which are different from the plurality of first frequencies and which are provided at regular intervals; and (B) determining, by performing the judging for one interval or a plurality of intervals, an interval so that the difference falls within the permissible range for all of the elements of the plurality of scattering parameters.

In this method, a frequency interval may be determined so that a reduction in the accuracy falls within a permissible range. Thus, appropriate circuit analysis such as circuit simulation may be performed.

Furthermore, the information processing method described above may further include extracting intervals between the plurality of first frequencies. In this case, in the determining described above, the judging may be performed for the extracted intervals in order from the longest interval. In this method, an interval as long as possible may be determined. Thus, an increase in the processing load of circuit analysis such as circuit simulation may be reduced.

Moreover, the present information processing method may further include deciding, when the intervals between the plurality of first frequencies are regular intervals, a value of a maximum frequency among the plurality of first frequencies so that the number of first frequencies is a power of 2. Also for the number of frequencies, a maximum frequency may be set so that the number of frequencies is a power of 2.

Furthermore, the present information processing method may further include reducing, when the number of sampling points in a case where sampling at frequencies, the frequencies being set at intervals which are each equal to the determined interval, up to a value of a maximum frequency among the plurality of first frequencies or up to a value of a maximum frequency among set frequencies, is performed is not a power of 2, the determined interval so that the number of sampling points is a power of 2. As mentioned above, also for the number of sampling points, the interval may be adjusted so that the number of sampling points is a power of 2.

Additionally, the first area may be calculated using a trapezoid having a side that is formed by connecting two consecutive first element values included in the first element value series with a straight line, sides that are formed by lines from the two first element values to the axis representing frequency, the lines being perpendicular to the axis representing frequency, and a side that corresponds to an interval between first frequencies, among the plurality of first frequencies, corresponding to the two first element values. The second area may be calculated using a trapezoid having a side that is formed by connecting two consecutive second element values included in the second element value series with a straight line, sides that are formed by lines from the two second element values to the axis representing frequency, the lines being perpendicular to the axis representing frequency, and a side that corresponds to an interval between second frequencies, among the plurality of second frequencies, corresponding to the two second element values. The amount of computation may be comparatively reduced by using the sum of the areas of trapezoids.

Note that a program for causing a computer to perform the above-described processes may be generated. The program is stored on a computer-readable storage medium or storage device. Examples of the computer-readable storage medium or storage device include a flexible disk, an optical disc such as a compact disc read-only memory (CD-ROM), a magneto-optical disk, a semiconductor memory (for example, a read-only memory (ROM)), and a hard disk.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A computer-readable recording medium having stored therein a program for causing a computer to execute an information processing comprising:

judging, for each of elements of a plurality of scattering parameters, whether a difference between a first area in a plane containing an axis representing frequency and an axis representing the element, and a second area in the plane is within a permissible range, the first area being surrounded by a first element value series of the element that is defined in advance for a plurality of first frequencies, the second area being surrounded by a second element value series that is obtained by performing interpolation calculation from the first element value series for a plurality of second frequencies which are different from the plurality of first frequencies and which are provided at regular intervals; and determining, by performing the judging for one interval or a plurality of intervals, an interval so that the difference falls within the permissible range for all of the elements of the plurality of scattering parameters.

2. The computer-readable recording medium according to claim 1, the program further causing the computer to execute the information processing comprising:

extracting intervals between the plurality of first frequencies, wherein, in the determining, the judging is performed for the extracted intervals in order from the longest interval.

3. The computer-readable recording medium according to claim 2, the program further causing the computer to execute the information processing comprising:

deciding, when the intervals between the plurality of first frequencies are regular intervals, a value of a maximum frequency among the plurality of first frequencies so that the number of first frequencies is a power of 2.

4. The computer-readable recording medium according to claim 1, the program further causing the computer to execute the information processing comprising:

reducing, when the number of sampling points in a case where sampling at frequencies, the frequencies being set at intervals which are each equal to the determined interval, up to a value of a maximum frequency among the plurality of first frequencies or up to a value of a maximum frequency among set frequencies, is performed is not a power of 2, the determined interval so that the number of sampling points is a power of 2.

5. The computer-readable recording medium according to claim 1, wherein the first area is calculated using a trapezoid having a side that is formed by connecting two consecutive first element values included in the first element value series with a straight line, sides that are formed by lines from the two first element values to the axis representing frequency, the lines being perpendicular to the axis representing frequency, and a side that corresponds to an interval between first frequencies, among the plurality of first frequencies, corresponding to the two first element values, and wherein the second area is calculated using a trapezoid having a side that is formed by connecting two consecutive second element values included in the second element value series with a straight line, sides that are formed by lines from the two second element values to the axis representing frequency, the lines being perpendicular to the axis representing frequency, and a side that corresponds to an interval between second frequencies, among the plurality of second frequencies, corresponding to the two second element values.

6. An information processing method comprising:

judging, for each of elements of a plurality of scattering parameters, whether a difference between a first area in a plane containing an axis representing frequency and an axis representing the element, and a second area in the plane is within a permissible range, the first area being surrounded by a first element value series of the element that is defined in advance for a plurality of first frequencies, the second area being surrounded by a second element value series that is obtained by performing interpolation calculation from the first element value series for a plurality of second frequencies which are different from the plurality of first frequencies and which are provided at regular intervals; and determining, by performing the judging for one interval or a plurality of intervals, an interval so that the difference falls within the permissible range for all of the elements of the plurality of scattering parameters.

7. An information processing apparatus comprising:

a judgment unit configured to judge, for each of elements of a plurality of scattering parameters, whether a difference between a first area in a plane containing an axis representing frequency and an axis representing the element, and a second area in the plane is within a permissible range, the first area being surrounded by a first element value series of the element that is defined in advance for a plurality of first frequencies, the second area being surrounded by a second element value series that is obtained by performing interpolation calculation from the first element value series for a plurality of second frequencies which are different from the plurality of first frequencies and which are provided at regular intervals; and a determination unit configured to determine, by causing the judgment unit to perform judgment of whether the difference is within the permissible range for one interval or a plurality of intervals, an interval so that the difference falls within the permissible range for all of the elements of the plurality of scattering parameters.

* * * * *